United States Patent
Beasom

(10) Patent No.: US 6,946,720 B2
(45) Date of Patent: Sep. 20, 2005

(54) BIPOLAR TRANSISTOR FOR AN INTEGRATED CIRCUIT HAVING VARIABLE VALUE EMITTER BALLAST RESISTORS

(75) Inventor: James D. Beasom, Melbourne Village, FL (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 10/366,158

(22) Filed: Feb. 13, 2003

(65) Prior Publication Data

US 2004/0159912 A1 Aug. 19, 2004

(51) Int. Cl.[7] ............................................. H01L 27/082
(52) U.S. Cl. ....................... 257/582; 257/565; 257/197; 257/580
(58) Field of Search ................................. 257/565–566, 257/567–573, 163–156, 578–582, 197–200; 438/330

(56) References Cited

U.S. PATENT DOCUMENTS

| | | | |
|---|---|---|---|
| 3,704,398 A | 11/1972 | Fukino | |
| 4,202,005 A | * 5/1980 | Sanders | ....................... 257/580 |
| 4,231,059 A | 10/1980 | Hower et al. | |
| 4,358,717 A | * 11/1982 | Elliott | ........................ 315/308 |

(Continued)

FOREIGN PATENT DOCUMENTS

WO    WO 98/45883    * 10/1998    ........... H01L/29/73

OTHER PUBLICATIONS

Gao, Guang–Bo, et al., "Thermal Design Studies of High–Power Heterojunction Bipolar Transistors", IEEE Transaction on Electron Devices, vol. 36, No. 5, pp. 854–863, May 1999.

Hallen, Anders, et al., "Multiple Proton Energy Irradiation For Improved GTO Thyristors", Solid–State Electronics, vol. 36, No. 2, pp. 133–141, 1993.

Liao, Chih–Hao, et al., "Optimum Design for a Thermally Stable Multifinger Power Transistor", IEEE Transactions on Electron Devices, vol. 49, No. 5, pp. 902–908, May 2002.

Liu, William, et al., "Theoretical Calculations of Temperature and Current Profiles in Multi–Finger Heterojunction Bipolar Transistors", Solid–State Electronics, vol. 36, No. 2, pp. 125–132, 1993.

*Primary Examiner*—Long Pham
*Assistant Examiner*—Thgao X. Le
(74) *Attorney, Agent, or Firm*—Fogg and Associates, LLC; Scott V. Lundberg

(57) ABSTRACT

An integrated circuit including a bipolar transistor with improved forward second breakdown is disclosed. In one embodiment, the bipolar transistor includes a base, a collector, a plurality of emitter sections coupled to a common emitter and a ballast emitter for each emitter section. Each ballast resistor is coupled between the common emitter and an associated emitter section. The size of each ballast resistor is selected so that the size of the ballast resistors vary across a two dimensional direction in relation to a lateral surface of the bipolar transistor.

24 Claims, 8 Drawing Sheets

U.S. PATENT DOCUMENTS

| | | | | |
|---|---|---|---|---|
| 4,639,757 A | * | 1/1987 | Shimizu | 257/580 |
| 4,656,496 A | * | 4/1987 | Widlar | 257/567 |
| 5,104,816 A | * | 4/1992 | Verret et al. | 438/361 |
| 5,182,531 A | * | 1/1993 | Fieldler et al. | 333/167 |
| 5,298,785 A | * | 3/1994 | Ito et al. | 257/538 |
| 5,321,279 A | * | 6/1994 | Khatibzadeh et al. | 257/197 |
| 5,378,922 A | * | 1/1995 | Sovero | 257/582 |
| 5,387,813 A | * | 2/1995 | Iranmanesh et al. | 257/563 |
| 5,389,554 A | | 2/1995 | Liu et al. | |
| 5,455,188 A | * | 10/1995 | Yang | 438/339 |
| 5,616,950 A | * | 4/1997 | Liu | 257/469 |
| 6,025,015 A | | 2/2000 | Landry-Coltrain et al. | |
| 6,064,109 A | * | 5/2000 | Blanchard et al. | 257/577 |
| 6,069,404 A | * | 5/2000 | Aufinger et al. | 257/728 |
| 6,303,973 B1 | * | 10/2001 | Nakagawa et al. | 257/565 |
| 6,348,724 B1 | * | 2/2002 | Koomen et al. | 257/577 |
| 6,437,421 B1 | * | 8/2002 | Thiel et al. | 257/592 |
| 6,455,919 B1 | * | 9/2002 | Brennan et al. | 257/616 |
| 6,483,170 B2 | * | 11/2002 | Johansson | 257/580 |
| 6,583,972 B2 | * | 6/2003 | Verhaege et al. | 361/56 |
| 6,587,320 B1 | * | 7/2003 | Russ et al. | 361/56 |
| 6,627,925 B1 | * | 9/2003 | Finlay | 257/197 |
| 6,686,801 B1 | * | 2/2004 | Cho et al. | 330/295 |
| 6,707,341 B2 | * | 3/2004 | Yamamoto et al. | 330/289 |
| 6,768,140 B1 | * | 7/2004 | Hong et al. | 257/197 |

* cited by examiner

BIPOLAR TRANSISTOR FOR AN INTEGRATED CIRCUIT HAVING VARIABLE VALUE EMITTER BALLAST RESISTORS

TECHNICAL FIELD

The present invention relates generally to bipolar devices incorporated in integrated circuits and in particular the present invention relates to an integrated circuit having a bipolar transistor with improved second breakdown.

BACKGROUND

Integrated circuits incorporate complex electrical components formed in semiconductor material into a single circuit. Generally, an integrated circuit comprises a substrate upon which a variety of circuit components are formed and connected to form a circuit. Integrated circuits are made of semiconductor material. Semiconductor material is material that provides for the formation of junctions depending on how it is doped, and by the fact that the resistance of the semiconductor material can vary by many orders-of-magnitude, also depending on the concentration of impurities or dopants. Semiconductor material is used to make electrical devices that exploit these properties.

Common devices formed in an integrated circuit are bipolar transistors. A bipolar transistor comprises a collector, emitter and base created by junctions formed in the substrate along with other devices that make up the integrated circuit. Examples of integrated circuits incorporating bipolar transistors are subscriber line interface IC's (SLIC's) and bipolar linear voltage regulators. A known limitation of bipolar transistors is forward second breakdown (FSB). FSB occurs when a bipolar transistor is being operated at high collector current and high collector-base voltage. These combined conditions result in high power dissipation which has a tendency to develop a local hot spot. Failure will occur at the local hot spot if the temperature goes to high.

In further detail, a hot spot can develop due to the negative temperature coefficient of the base emitter voltage (Vbe) at constant collector current. Any non-uniformity (such as a fluctuation in base doping) in a portion of the device that results in a locally higher collector current will lead to higher power dissipation in that part of the device. The increased power will induce a local increase in temperature. The increased temperature will induce further increase in current due to negative temperature coefficient of Vbe. This positive feedback mechanism can raise the local temperature (called a local hot spot) high enough that the device fails.

One method for improving the FSB performance of a bipolar device is to form a resistance in series with the emitter to provide negative feedback to compensate for the positive feedback caused by the negative temperature coefficient of Vbe. This can be done by breaking the emitter into several individual emitter segments and forming a resistor in series with each segment. Another method is to use multiple resistors, each in series with several emitter segments, to reduce the number of resistors required and to simplify the connection of the resistors to the emitters. Such resistors are often referred to as ballast resistors or emitter resistors.

Emitter resistors as described above, improve FSB but still further improvements are desired. A known characteristic of a relatively large transistor device having a plurality of emitters or a simple large emitter is that the device will typically have non-uniform temperature even when the emitter current is uniformly distributed. For example, one common occurrence found in large transistors is that the temperature is highest in the center and lowest at the perimeter as a result of the design of the transistor. Another example of a common occurrence is that local hot spots develop as the result of heat generated by one or more adjacent devices formed in the same integrated circuit. This temperature non-uniformity can be particularly acute in devices made in SOI wafers because the oxide forming the isolation has much lower thermal conductivity than the silicon. As a result, large lateral thermal gradients can develop that effect the FSB. It is desired in the art to have an integrated circuit with a bipolar transistor device with improved FSB.

For the reasons stated above and for other reasons stated below which will become apparent to those skilled in the art upon reading and understanding the present specification, there is a need in the art for an integrated circuit having a bipolar transistor with improved FSB.

SUMMARY

The above-mentioned problems of local hot spots and other problems are resolved by the present invention and will be understood by reading and studying the following specification.

In one embodiment, a bipolar transistor formed in an integrated circuit is disclosed. The bipolar transistor comprises a base, a collector, a plurality of emitter sections and a plurality of ballast resistors. The plurality of emitter sections are coupled to an emitter common interconnect line. Each ballast resistor is coupled between the emitter common interconnect line and an associated emitter section, wherein the size of each ballast resistor is selected so that the size of the ballast resistors vary across a two dimensional direction in relation to a lateral surface of the bipolar transistor.

In another embodiment, another bipolar transistor formed in an integrated circuit is disclosed. The bipolar transistor comprises a collector, a plurality of collector contacts, a plurality of base strips, a plurality of emitters, an emitter common interconnect line and a plurality of emitter resistors. The collector is of a first conductivity type with low dopant concentration which is formed adjacent a working surface of a substrate. The plurality of collector contacts are of the first conductivity type and have a high dopant concentration and are further formed in the collector adjacent the working surface of the substrate. The plurality of base stripes are of a second conductivity type and are formed in the collector adjacent the working surface of the substrate. The plurality of emitters are of the first conductivity type with high dopant concentration and are formed in each base stripe adjacent the working surface of the substrate. The emitter common interconnect line is coupled to each emitter. Moreover, each emitter resistor is coupled between an associated emitter and the emitter common interconnect line. Each emitter resistor has a selected resistance value to achieve a varying in resistance across a two dimensional direction in relation to the working surface of the substrate.

In further another embodiment, a subscriber line interface (SLIC) is disclosed. The SLIC comprises a TIP amplifier and a ring amplifier. Each TIP amplifier and ring amplifiers further comprise at least one relatively large bipolar transistor. Moreover, each one of the at least one relatively large bipolar transistor comprises a base, a collector, a common emitter conductor, a plurality of emitter sections and a plurality of ballast resistors. The plurality of emitter sections are coupled to the common emitter conductor. Each ballast resistor is coupled between the common emitter conductor and an associated emitter section, wherein the size of each ballast resistor is selected to achieve ballast resistors of varying sizes across a two dimensional direction relative to a lateral surface of the SLIC.

In further still another embodiment, a method of forming a relatively large bipolar transistor in an integrated circuit is disclosed. The method comprises forming a collector contained in an isolation island in a substrate of the integrated circuit. Forming a base in the collector adjacent a working surface of the substrate. Forming a plurality of emitters in the base adjacent the working surface of the substrate. Forming a common emitter interconnect and forming ballast emitter resistors for select emitters. Each ballast emitter resistor is coupled between an associated emitter and the common emitter interconnect. Each ballast resistor is further formed to have a selected resistance value. Moreover, the selected resistance value of each ballast resistor is selected so the values of the ballast resistors vary in a two dimensional direction in relation to the working surface of the bipolar transistor.

In yet another embodiment, a method of forming a bipolar transistor in an integrated circuit is disclosed. The method comprises forming an island having isolation walls in a substrate. Forming a collector in the island adjacent a working surface of the substrate. Forming a plurality of base stripes in the collector adjacent the working surface of the substrate. Forming a plurality of collector contacts adjacent the working surface of the substrate. Forming a plurality of emitters in each base stripe adjacent the working surface of the substrate and forming an emitter resistor for each emitter. Each emitter resistor is formed a select vertical distance from the working surface of the substrate. Moreover, each emitter resistor is further formed laterally between an associated collector contact and an associated emitter.

BRIEF DESCRIPTION OF THE DRAWINGS

The present invention can be more easily understood and further advantages and uses thereof more readily apparent, when considered in view of the description of the preferred embodiments and the following figures in which.

In accordance with common practice, the various described features are not drawn to scale but are drawn to emphasize specific features relevant to the present invention. Reference characters denote like elements throughout Figures and text.

DETAILED DESCRIPTION

Figure 1:
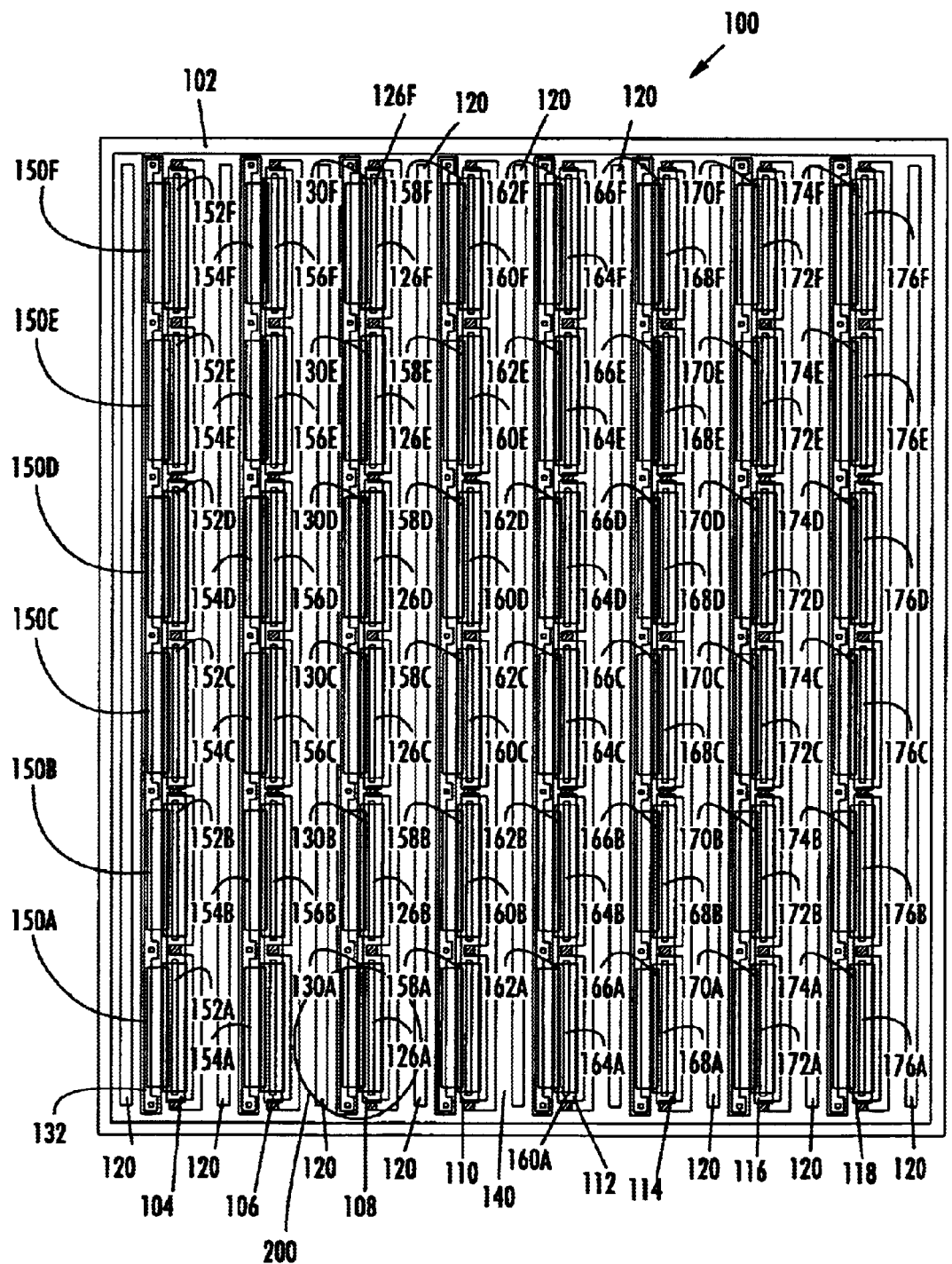
FIG. 1 is a plan view of a transistor formed in an integrated circuit of the present invention.

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Embodiments of the present invention include integrated circuits that have bipolar devices with improved FSB. In particular, the present invention provides embodiments of bipolar transistor devices that achieve relatively uniform lateral temperatures across the devices with the use of variable value emitter resistors to reduce hot spots. In one embodiment of a relatively large bipolar device with multiple emitters, this is achieved by positioning smaller value resistors coupled to associated emitters around the perimeter of the transistor (i.e. an outer ring of the emitters). Resistors of a larger value are then positioned adjacent the outer ring. The progression of resistor values is continued with the emitters in the center of the device being connected to the largest value resistors. The larger resistors reduce more of the current and therefore the power is reduced in the center of the device which reduces the temperature at the center. In other embodiments of the present invention, where hot spots are not located in the center, the resistor values are adjusted accordingly. Accordingly, embodiments of the present invention address temperature gradients in two dimensions by varying the size of emitter resistors in the two dimensional direction in relation to a working surface of the bipolar device.

In the following description, the term substrate is used to refer generally to any structure on which integrated circuits are formed, and also to such structures during various stages of integrated circuit fabrication. This term includes doped and undoped semiconductors, epitaxial layers of a semiconductor on a supporting semiconductor or insulating material, combinations of such layers, as well as other such structures that are known in the art. Terms of relative position as used in this application are defined based on a plane parallel to the conventional plane or working surface of a wafer or substrate, regardless of the orientation of the wafer or substrate. The term "lateral" as used in this application is defined as a direction that runs parallel to the conventional plane or working surface of a wafer or substrate, regardless of the orientation of the wafer or substrate. The term "vertical" refers to a direction perpendicular to the lateral direction. Terms, such as "on", "side", "higher", "lower", "over", "top" and "under" are defined with respect to the conventional plane or working surface being on the top surface of the wafer or substrate, regardless of the orientation of the wafer or substrate.

Referring to FIG. 1, a plan view of transistor 100 is formed in an integrated circuit of one embodiment of the present invention is illustrated. Transistor 100 includes eight bases 104, 106, 108, 110, 112, 114, 116, 118, formed in an island. The island is defined by an isolation perimeter 102. The island in this embodiment is doped to form the collector 140 of the transistor 100. In one embodiment, the isolation perimeter 102 is formed by trench isolation techniques that provide effective sidewall isolation from other devices formed in the integrated circuit. Also illustrated in FIG. 1 are collector contacts 120 which provide contacts to the collector 140.

Each base 104, 106, 108, 110, 112, 114, 116 or 118 in this embodiment has six associated emitter resistors and six associated emitters. In particular, base 104 is associated with emitter resistors 150A through 150F and emitters 152A through 152F. Base 106 is associated with emitter resistors 154A through 154F and emitters 156A through 156F. Base 108 is associated with emitter resistors 130A through 130F and emitters 126A through 126F. Base 110 is associated with emitter resistors 158A through 158F and emitters 160A through 160F. Base 112 is associated with emitter resistors 162A through 162F and emitters 164A through 164F. Base 114 is associated with emitter resistors 166A through 166F and emitters 168A through 168F. Base 116 is associated with emitter resistors 170A through 170F and emitters 172A through 172F. Base 118 is associated with emitter resistors 174A through 174F and emitters 176A through 176F. Accordingly, transistor 100 of this embodiment includes a 6 by 8 emitter array that includes 48 emitters and 48 associated emitter resistors. It will be understood in the art that the number of emitters and emitter resistors associated with each base 108 can vary and the present invention is not limited to six emitters and six emitter resistors.

Figure 2:
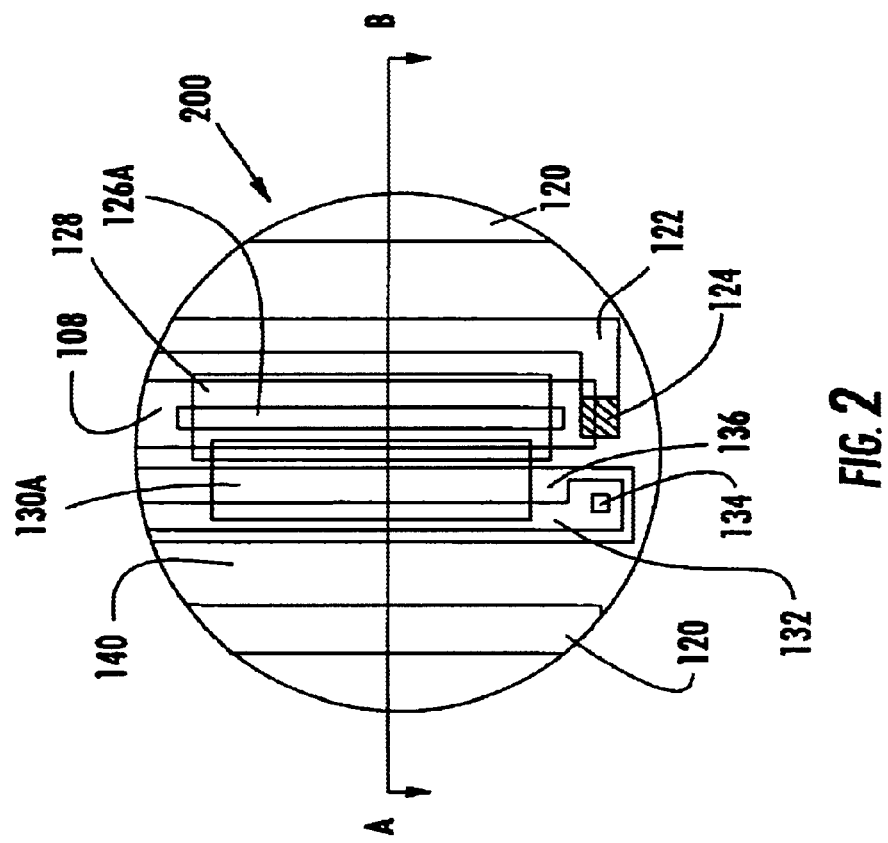
FIG. 2, is an exploded view of a portion of the transistor of FIG. 1.

To provide a better illustration of the components of transistor 100, an exploded plan view of section 200 of transistor 100 is shown in FIG. 2. As FIG. 2, illustrates, collector contacts 120 run parallel to base 108. Emitter 126A is formed in base 108. Also illustrated is base interconnect line 122 which is connected to base 108 via base contact 124. The present invention includes emitter resistor 130A. Emitter resistor 130A can also be referred to as a ballast resistor 130A. The emitter resistor 130A is coupled to emitter 126A by emitter-resistor connection 128. In addition, emitter resistor 130A is coupled to emitter common interconnect line 132. Also illustrated in FIG. 2, is via 134 which connects the emitter common interconnect line 132 to a second conduction path 136 which, in one embodiment, is made from a second layer metal.

Figure 3:
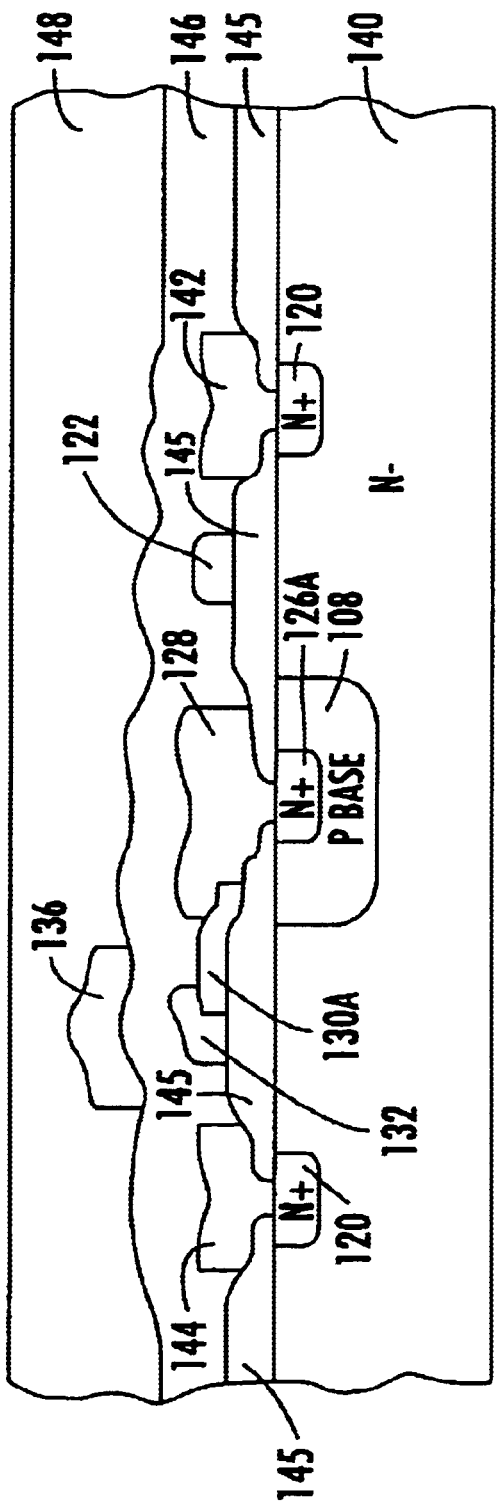
FIG. 3, is a cross-sectional side view along line A_B of FIG. 2.

A cross-sectional side view along line A__B of FIG. 2 is illustrated in FIG. 3. As FIG. 3 illustrates, base 108 (a P base 108 in this embodiment) is formed in island 140. Emitter 126A is then formed in the base 108. Collector contacts 120 are also illustrated in FIG. 3. Transistor 100 also includes a first layer of dielectric 145, a second layer of dielectric 146 and protective overcoat layer 148. As illustrated in FIG. 3, electrical contacts 144 and 142 are electrically coupled to respective collector contacts 120. Base interconnect line 122 is also illustrated. Emitter-resistor contact 128 provides an electrical connection between the emitter 126A and the emitter resistor 130A. Emitter common interconnect line 132 is also illustrated. In addition, the second conductive path 136 is further illustrated. The second conduction path 136, is coupled to the emitter common inter connect line 132 through via 134 (illustrated in FIG. 2) to reduce resistance. As illustrated in FIG. 3, the emitter resistor 130A is formed to laterally extend over a portion of the base 108 and a portion of the collector 140 that is adjacent the base 108. This design allows for a bipolar transistor device with relatively small base area which minimizes base capacitance and base leakage.

Figure 3A:
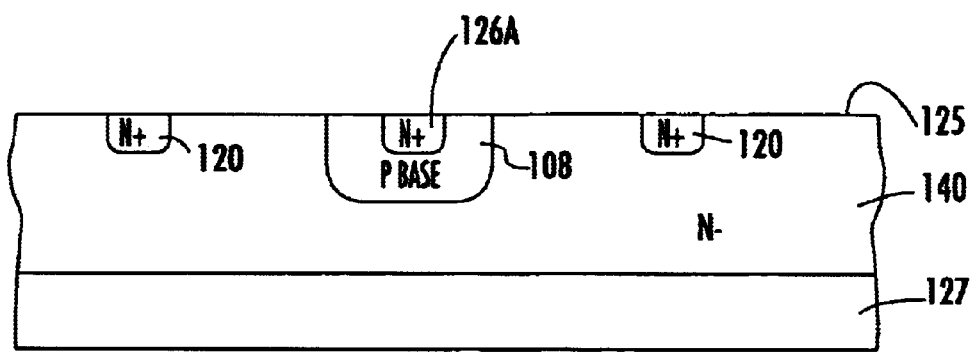
FIGS. 3A–3D are cross-sectional side views illustrating the formation of one embodiment of the present invention.
Figure 3B:
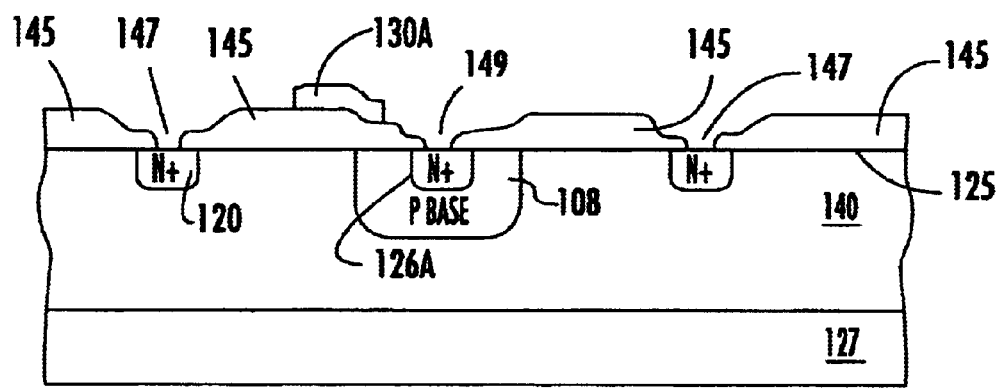
Figure 3C:
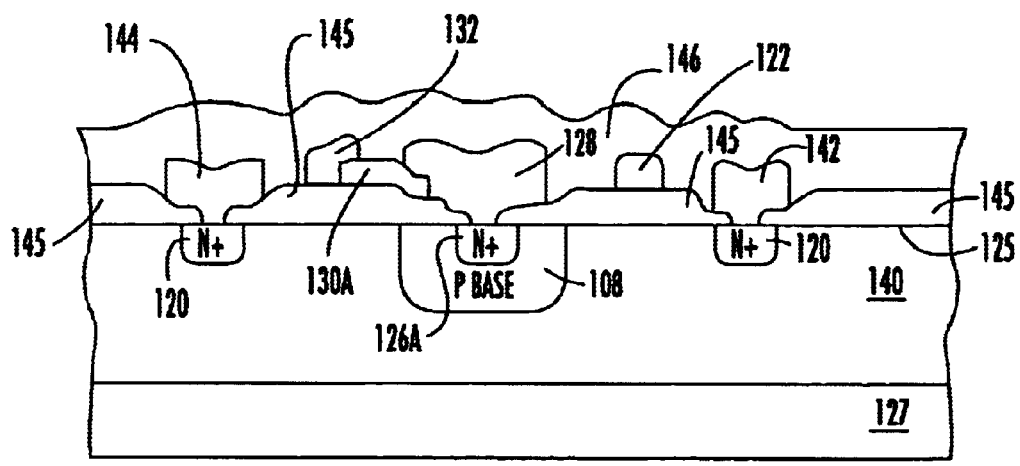

Referring to FIGS. 3A through 3C cross-sectional side views of section 200 along line A-B of FIG. 2 is shown. FIGS. 3A through 3C illustrate one method of forming one embodiment of the present invention. In FIG. 3A, a substrate 127 upon which transistor 100 is formed is doped with N type dopants of low concentration to form an area of N− type dopant concentration in the substrate adjacent working surface 125 of the substrate 127 which becomes the collector 140 of transistor 100. The base 108 is then formed by using a masked diffusion process that implants P type dopants through a select area of the working surface 125 of the substrate 127. Next, collector contacts 120 and emitter 126A are formed by implanting N type dopants of high concentration through select areas of the working surface 125 of the substrate 127. Implanting the N+ dopants in select areas of the working surface 125 of the substrate 127 to form the collector contacts 120 and the emitter 126A is achieved with the use of a mask. As illustrated in FIG. 3A, emitter 126A is formed in the base 108.

A first dielectric layer 145 is then formed overlaying the working surface of the substrate 127. This is illustrated in FIG. 3B. The first dielectric layer 145 is then patterned to form openings 147 and 149 to the collector contacts 120 and emitter 126A respectfully. Emitter resistor 130A is then formed overlaying the first dielectric layer 145 in a select area as illustrated in FIG. 3B. The select area laterally extends over a portion of the base 108 and a portion of the collector 140 adjacent the base 108 laterally between collector contact 120 and emitter 126. The emitter resistor 130A (or ballast resistor) is a thin film resistor. The emitter resistor 130A is formed by depositing, growing or through the use of other techniques known in the art. The resistor value of the emitter resistor 130A is set by known methods such as changing its width or changing the resistivity of the material the resistor is formed from. The resistor value is given by the expression R=ρL/W, where R=the resistance of the resistor, ρ=resistivity of the thin film, L=the length of the resistor measured between the emitter common interconnect line 132 and the emitter resistor connector 128 (referring to FIG. 3C), W=the width of the thin film.

Figure 3D:
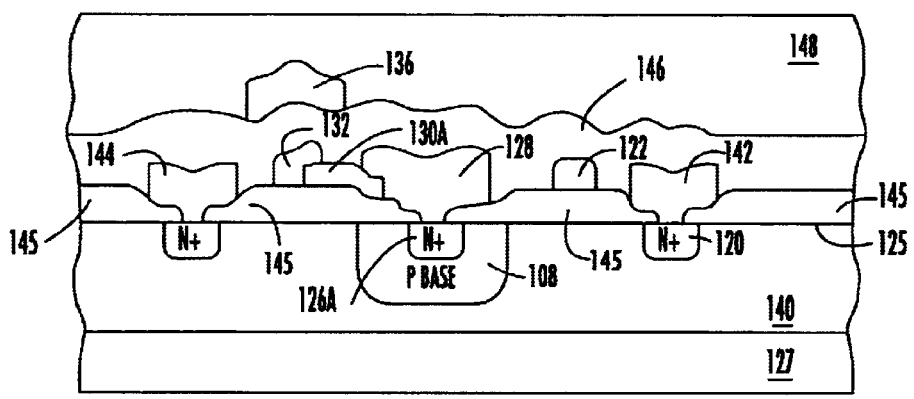

A first conductive layer is then deposited overlaying the first dielectric layer 145, the collector contacts 120 and the emitter 126A though the openings 147 and 149 respectively and the emitter resistor 130A. The first conductive layer is then patterned to form electrical contacts 142 and 144, emitter-resistor connector 128, base interconnect line 122 and emitter common interconnect line 132 as illustrated in FIG. 3C. In one embodiment, the first conductive layer is a first metal layer. A second layer of dielectric 146 is then formed overlaying the first dielectric layer 145, electrical contacts 144, emitter-resistor connector 128, base interconnect line 122 and emitter common interconnect line 132 as illustrated in FIG. 3C. A second conductive layer is then formed overlaying the second dielectric layer 146. The second conductive layer is then patterned to form the second conductive path 136 as illustrated in FIG. 3D. In one embodiment, the second conductive layer is a second metal layer. Next the protective overcoat layer 148 is formed overlaying the second dielectric layer 146 and the second conductive path 136. In one embodiment, the protective overcoat layer is a layer of nitride.

Figure 4:
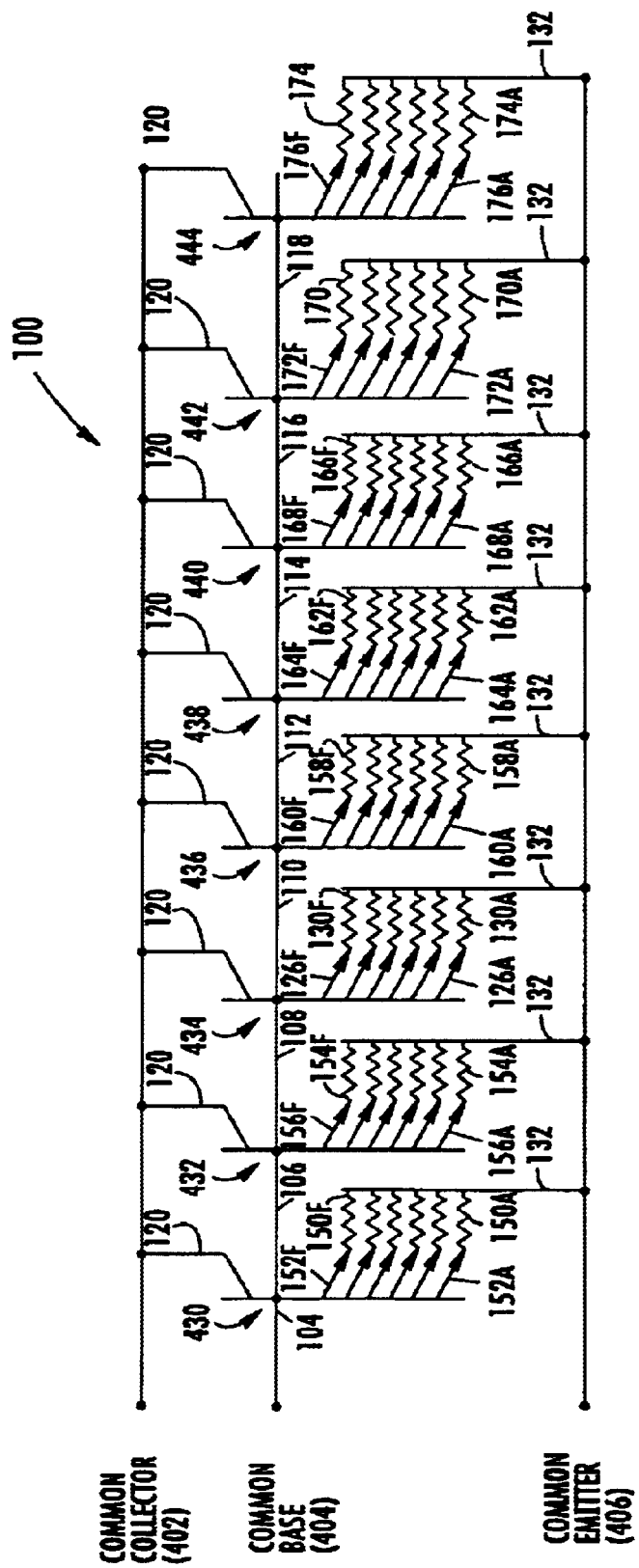
FIG. 4, is a schematic diagram of one embodiment of the present invention.

Referring to FIG. 4, a schematic diagram of the embodiment of FIG. 1 is illustrated. In particular, the schematic diagram of FIG. 4 illustrates further connections of transistor 100. As illustrated, transistor 100 is made of several transistors 430, 432, 434, 436, 438, 440, 442 and 444 which are integrated together by common collector conductor 402, common base conductor 404 (base interconnect line 404) and common emitter conductor 406 (emitter common interconnect line 406).

A known characteristic of a transistor device like the transistor 100 embodiment illustrated in FIG. 1 is that the transistor 100 will have a non-uniform temperature throughout the device even when the emitter current is uniformly distributed. In particular, temperature is typically highest at the center of the device and lowest at the perimeter of the device because heat generated near the perimeter of the device more easily flows out of the transistor through the isolation sidewalls of the island. This non-uniformity can be particularly acute in devices made from in SOI wafers because the oxide forming the isolation has much lower thermal conductivity than does the silicon. Large lateral thermal gradients can develop in this case. Embodiments of the present invention reduce the non-uniform temperatures by using variable value emitter resistors. Referring to FIG. 1, the emitter resistors around the perimeter transistor 100, that is, emitter resistors 150A–150F, 174A–174F, 154F, 130F, 158F, 162F, 166F, 170F, 154A, 130A, 158A, 162A, 166A and 170A, are formed to have a relatively low resistance value. The next emitter resistors that are formed further in the transistor 100 and are adjacent the emitter resistors around the perimeter of the transistor 100, are formed to have a larger resistance value. These emitter resistors include emitter resistors, 154B–154E, 170B–170E, 130B, 158B, 162B, 166B, 158E, 162E, 166E and 130E. The progression of resistance values is continued as the emitter resistors get closer to the center of the transistor 100 such that the emitter resistors in the center of the device have the highest resistance values. For example, in the embodiment of FIG. 1, emitter resistors 130C, 130D, 158C, 158D, 162C, 162D, 166C and 166D will be formed to have the largest resistance values. In one embodiment, the resistance values are selected based on a combination of thermal and electrical modeling or simulation.

In regards to FIG. 1, an example of an embodiment of the present invention designed to operate at approximate 120 mamps includes resistance values of 265 Ω, 310 Ω, and 370 Ω. In this embodiment, emitter resistors around the perimeter, 150A–150F, 174A–174F, 154F, 130F, 158F, 162F, 166F, 170F, 154A, 130A, 158A, 162A, 166A and 170A, are formed to have the relatively low resistance value of approximately 265 Ω. The next emitter resistors that are formed further in the device, emitter resistors 154B–154E, 170B–170E, 130B, 158B, 162B, 166B, 158E, 162E, 166E and 130E, that are adjacent the emitter resistors around the perimeter of the transistor 100, are formed to have a larger resistance value of approximately 310 Ω. The remaining emitter resistors 130C, 130D, 158C, 158D, 162C, 162D, 166C and 166D have a resistance value of approximately 370 Ω.

This design provides higher resistance values in the region of the device where heat concentrates. The higher resistance value emitter resistors reduce the current which results in locally lower heat generation. The reduced heat generation reduces the temperature rise which provides a more uniform temperature across the device. The more uniform temperature across the device allows the device to operate at a higher current before any part of the device reaches the temperature at which it fails. This provides the improved FSB. In another embodiment where other devices in the integrated circuit radiate heat which cause hot spots in a transistor device in one or more locations other than the center of the transistor 100, the resistance values of the emitter resistors are adjusted accordingly to achieve a relatively uniform temperature across the transistor. Moreover, in some embodiments of the present invention, a relatively uniform temperature in a two dimensional direction is achieved by using emitter resistors (ballast resistor) of a relatively low size in association with select emitter segments. Further still in other embodiments, emitter resistors are not used at all with select emitter segments to achieve the relatively uniform temperatures in the two dimensional direction.

Figure 5:
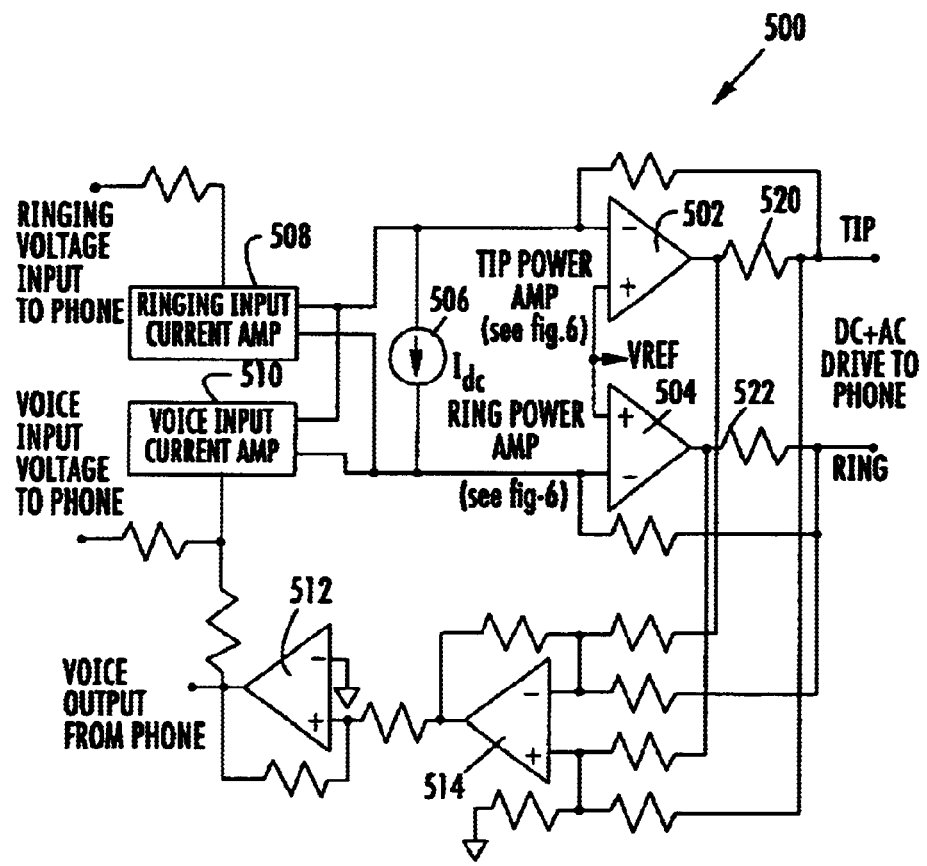
FIG. 5, is a schematic diagram of an embodiment of a SLIC of the present invention.

Referring to FIG. 5 a schematic diagram of a subscriber line interface (SLIC) integrated circuit 500 which includes embodiments of the present inventions is illustrated. As illustrated, the SLIC includes a ringing input current amplifier 508, a voice input current amplifier 510, a DC current source 506 and amplifiers 512 and 514. Also included are TIP power amplifier 502 and ring power amplifier 504. SLIC 500 provides an analog interface between a central office and a subscriber's phone lines. The DC current reference shown in FIG. 5 is coupled to the TIP and ring power amplifiers 502 and 504. Voice input current amplifier 510 creates a differential current signal that is passed to the power amps 502 and 504 to drive audio signals to the phone. The current sensing resistors 520 and 522 capture audio signals from the phone and pass them back to the system by way of sense amplifier 514 and transmit amplifier 512. Sense amplifier 514 and transmit amplifier 512 also serve in a feedback control loop to synthesize an impedance at TIP/ring terminals that can be set to match that of the phone connected there. The ringing input current amplifier 508 is a high gain block that generates a large, low frequency signal that activates the ringer contained within the phone. Moreover, the current sensing resistors 520 and 522 also serve to detect when the phone has gone off-hook by indicating the presence of current to the phone.

Figure 6:
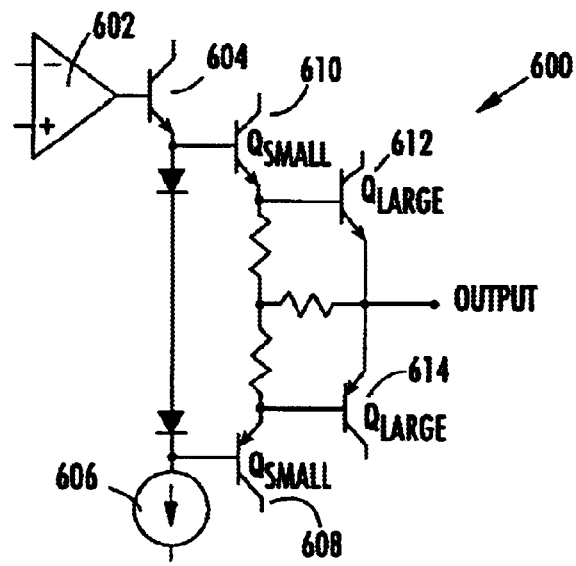
FIG. 6, is schematic diagram of an embodiment of a power amplifier of the present invention.
Figure 7:
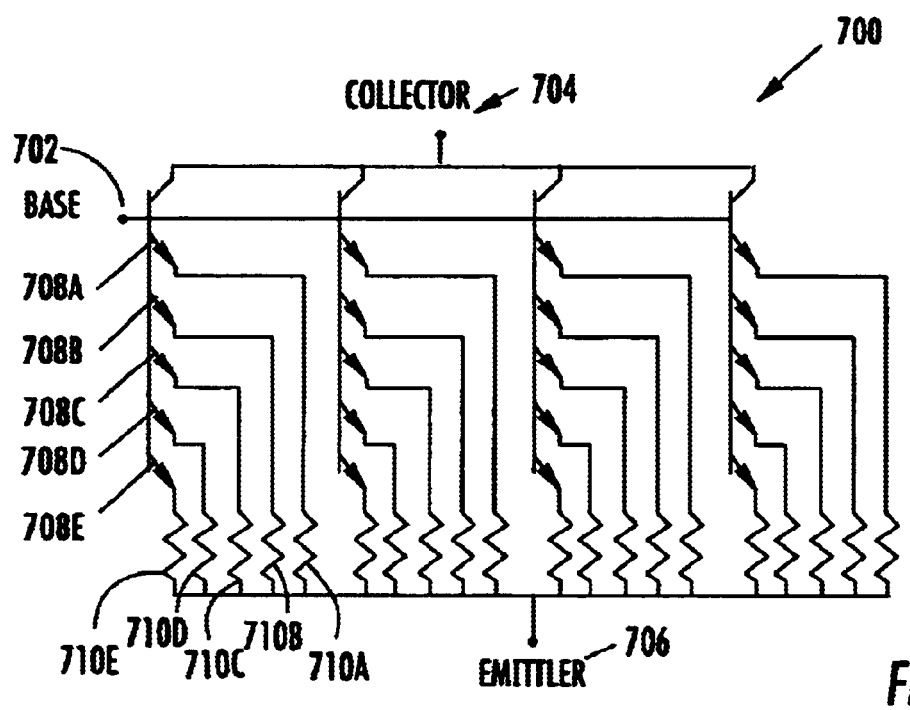
FIG. 7 is a schematic diagram illustrating one embodiment of a relatively large NPN transistor of the present invention.
Figure 8:
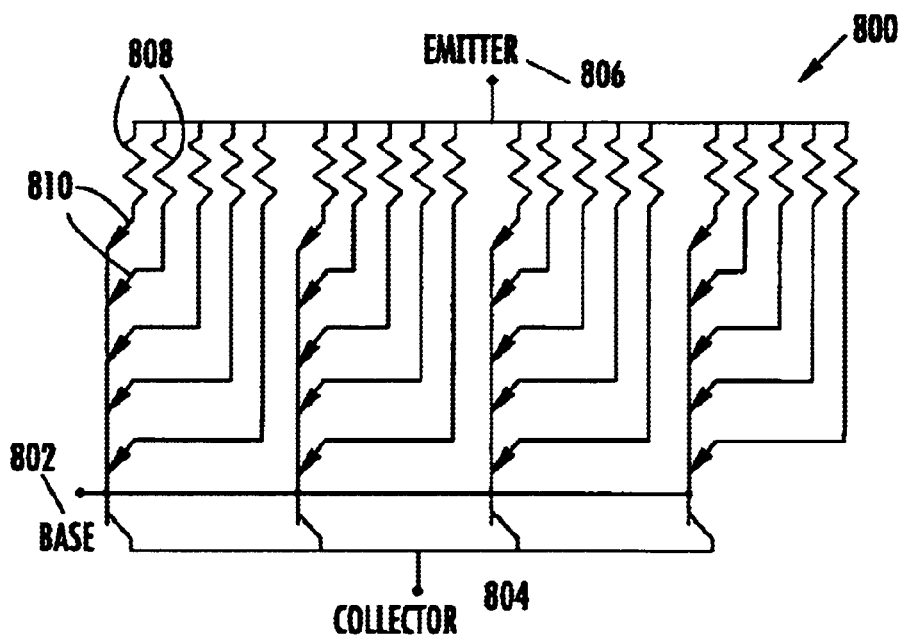
FIG. 8 is schematic diagram of one embodiment of a relatively large PNP transistor the present invention.

In FIG. 6, a schematic diagram of one embodiment of a power amplifier 600 such as the tip power amplifier 502 and the ring power amplifier 504 of FIG. 5 is illustrated. As FIG. 6 illustrates, the power amplifier includes amplifier 602, transistor 604, current source 606 and relatively small transistors 608 and 610. The Power amplifier 600 further includes relatively large transistors 612 and 614 similar to the transistors with ballast resistors as described above. In fact, an example of one embodiment of a relatively large transistor 700 that is similar to the relatively large transistors 612 and 614 is illustrated in the schematic diagram of FIG. 7. As FIG. 7 illustrates, the relatively large NPN transistor 700 includes a common base conductor 702, a common collector conductor 704 and a common emitter conductor 706. As with the other embodiments of the transistors described above, the emitter of transistor 700 is broken up into segments where each segment is coupled in series with an associated ballast resistor. For example, emitter segments 708A through 708E are coupled in series with ballast resistors 710A through 710E respectfully. As described above, the size of the resistors 710A through 710E (as well as the other ballast resistors of the NPN transistor 700) are selected to achieve relatively uniform lateral temperatures. Another example of an embodiment of the relatively large transistors 612 and 614 is illustrated in the PNP transistor 800 embodiment of FIG. 8. As illustrated, this PNP transistor 800 includes a common base conductor 802, a common collector conductor 804 and a common emitter conductor 806. Moreover as with the other embodiments of the present invention, the emitter is broken up into emitter segments 810 and each emitter segment is coupled to an associated resistor 808. The size of each resistor 808 is selected to achieve relatively uniform lateral temperatures.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A bipolar transistor formed in an integrated circuit, the bipolar transistor comprising:
    a base;
    a collector;
    a plurality of emitter sections coupled to an emitter common interconnect line; and
    a plurality of ballast resistors, each ballast resistor being coupled between the emitter common interconnect line and an associated emitter section, wherein the resistor valve of each ballast resistor is selected so that the resistor valve of the ballast resistors at different locations vary across a two dimensional direction in relation to a lateral surface single of the bipolar transistor.

2. The bipolar transistor of claim 1, wherein the resistor valve of each ballast resistor is selected to achieve relatively uniform temperatures across a two dimensional lateral surface of the bipolar transistor.

3. The bipolar transistor of claim 1, further comprising:
    a common collector conductor, and
    one or more collector contacts coupled between the collector and the common collector conductor.

4. The bipolar transistor of claim 1, wherein the base is segmented into base strips, each base strip is coupled to a common base conductor.

5. The bipolar transistor of claim 1, wherein the collector is formed in an island of the integrated circuit.

6. The bipolar transistor of claim 1, further comprising:
    an isolation perimeter that defines an outer boundary of the bipolar transistor in the integrated circuit.

7. The bipolar transistor of claim 6, wherein the ballast resistors formed adjacent the isolation perimeter have relatively small resistance values as compared to ballast resistors formed adjacent a center location of the bipolar transistor.

8. The bipolar transistor of claim 6, wherein the ballast resistors formed in a location between the isolation perimeter and the center location have a resistance value somewhere between the resistance value of the ballast resistors adjacent the isolation perimeters and the ballast resistors adjacent the center location.

9. A bipolar transistor formed in an integrated circuit, the bipolar transistor comprising:
    a collector of a first conductivity type with low dopant concentration formed adjacent a working surface of a substrate;
    a plurality of collector contacts of the first conductivity type having high dopant concentration formed in the collector adjacent the working surface of the substrate;
    a plurality of base stripes of a second conductivity type formed in the collector adjacent the working surface of the substrate;
    a plurality of emitters of the first conductivity type with high dopant concentration formed in each base stripe adjacent the working surface of the substrate;
    an emitter common interconnect line coupled to each emitter; and
    a plurality of emitter resistors, each emitter resistor being coupled between an associated emitter and the emitter common interconnect line, each emitter resistor having a selected resistance value to achieve a varying in resistance at different locations across a two dimensional direction in relation to the working surface of the substrate of the single bipolar transistor.

10. The bipolar transistor of claim 9, wherein the selected values of the emitter resistance are chosen to achieve a relatively uniform operation temperature in a lateral two dimension direction in relation to the working surface of the substrate.

11. The bipolar transistor of claim 9, wherein each emitter resistor is a thin film resistor.

12. The bipolar transistor of claim 9, wherein each emitter resistor is located a select vertical distance from the working surface of the substrate.

13. The bipolar transistor of claim 9, wherein each emitter resistor extends laterally over a portion of its associated base and a portion of the collector directly adjacent the associated base.

14. The bipolar transistor of claim 9, further comprising:
    an emitter-resistor connection for each emitter resistor adapted to electrically couple each emitter resistor to its associated emitter.

15. The bipolar transistor of claim 9, further comprising:
    a second conduction path coupled to the emitter common interconnect line to reduce resistance, the second conductive path formed above the emitter common interconnect line.

16. The bipolar transistor of claim 15, wherein the second conduction path is formed from a second metal layer.

17. The bipolar transistor of claim 9, further comprising:
    an isolation perimeter having isolation sidewalls to isolate the bipolar transistor from other devices of the integrated circuit, wherein the isolation perimeter defines the boundaries of the bipolar transistor.

18. The bipolar transistor of claim 17, wherein emitter resistors formed adjacent the isolation perimeter have smaller resistance values than emitter resistors formed adjacent a center of the bipolar transistor.

19. The bipolar transistor of claim 18, wherein the emitter resistors located laterally between the emitter resistors adjacent the isolation perimeter and the emitter resistors formed adjacent the center of the bipolar transistor have a resistance value between the resistance values of the emitter resistors adjacent the isolation perimeter and the resistance values of the emitter resistors adjacent the center of the bipolar transistor.

20. A subscriber line interface (SLIC) comprising:
    a TIP amplifier;
    a ring amplifier; and
    wherein each of the TIP amplifier and the ring amplifiers comprise,
        at least one relatively large bipolar transistor, each the at least one relatively large bipolar transistor comprising,
            a base,
            a collector,
            a common emitter conductor,
            a plurality of emitter sections coupled to the common emitter conductor, and
            a plurality of ballast resistors, each ballast resistor coupled between the common emitter conductor and an associated emitter section, wherein the resistor valve of each ballast resistor is selected to achieve ballast resistors of varying values at different locations across a two dimensional direction relative to a lateral surface of the SLIC.

21. The SLIC of claim 20 wherein the resistor values of the ballast resistors are selected to achieve relatively uniform temperatures across a two dimensional direction relative to the lateral surface of the SLIC.

22. The subscriber line interface of claim 20, wherein relatively large resistors are formed in local hot spots of the relatively large bipolar transistors to improve forward second breakdown.

23. The subscriber line interface of claim 20, wherein at least one of the relatively large bipolar transistors is a PNP transistor.

24. The subscriber line interface of claim 20, wherein at least one of the relatively large bipolar transistors is a NPN transistor.

* * * * *